United States Patent [19]
Saitoh

[11] Patent Number: 5,633,517
[45] Date of Patent: May 27, 1997

[54] SEMICONDUCTOR DEVICE CONSTITUTING MULTI-STAGE POWER AMPLIFIER

[75] Inventor: Yasuo Saitoh, Tokyo, Japan

[73] Assignee: NEC Corporation, Tokyo, Japan

[21] Appl. No.: 571,034

[22] Filed: Dec. 12, 1995

Related U.S. Application Data

[63] Continuation of Ser. No. 285,526, Aug. 4, 1994, abandoned.

[30] Foreign Application Priority Data

Aug. 5, 1993 [JP] Japan .................................... 5-212082

[51] Int. Cl.$^6$ ................................................... H01L 29/80
[52] U.S. Cl. ............................ 257/277; 257/728; 257/275
[58] Field of Search ........................... 330/307; 257/275, 257/276, 277, 659, 280, 773, 728

[56] References Cited

U.S. PATENT DOCUMENTS

| | | | |
|---|---|---|---|
| 3,942,186 | 3/1976 | McAvoy et al. | 257/275 |
| 4,104,672 | 8/1978 | DiLorenzo et al. | 257/280 |
| 4,313,126 | 1/1982 | Krumm et al. | 257/270 |
| 5,061,903 | 10/1991 | Vasile | 330/331 |
| 5,063,177 | 11/1991 | Geller et al. | 257/728 |
| 5,185,534 | 2/1993 | Sakamoto et al. | 257/276 |
| 5,227,738 | 7/1993 | Shiga | 330/307 |
| 5,283,452 | 2/1994 | Shih et al. | 257/276 |
| 5,287,072 | 2/1994 | Kojima et al. | 330/307 |
| 5,523,593 | 6/1996 | Kaguya et al. | 257/192 |

FOREIGN PATENT DOCUMENTS

| | | | |
|---|---|---|---|
| 0506122 | 9/1992 | European Pat. Off. | 257/275 |
| 61-263249 | 11/1986 | Japan | 257/280 |

OTHER PUBLICATIONS

Emori et al, "Multichip IC Series for Handheld Cellular Telephones", NEC vol. 46, Feb. 1993, pp. 109–112.

*Primary Examiner*—Donald T. Hajec
*Assistant Examiner*—Mark Tremblay
*Attorney, Agent, or Firm*—Sughrue, Mion, Zinn, Macpeak & Seas

[57] ABSTRACT

A semiconductor device has a multi-stage power amplifier, which is composed of a plurality of transistors each having an input terminal and an output terminal. The transistors are disposed on a chip in such a way that the input terminals and output terminals of the respective transistors are arranged in directions so as to alternate from one another. A ground metallization layer is formed on a back and a side surface and on an outside perimeter section of a front surface of the chip and a ground terminal of each transistor is connected to the ground metallization layer. Each of the transistors comprises a gate pad, a source pad, a drain pad and an active region which are formed on a semi-insulating GaAs substrate. The gate pad, the source pad and the drain pad are in contact respectively with a gate electrode, a source electrode and a drain electrode formed in the active region. All transistors constituting an ultra-high frequency multi-stage power amplifier are implemented onto a single chip, thus enhancing device miniaturization and preventing undesirable oscillation.

7 Claims, 5 Drawing Sheets

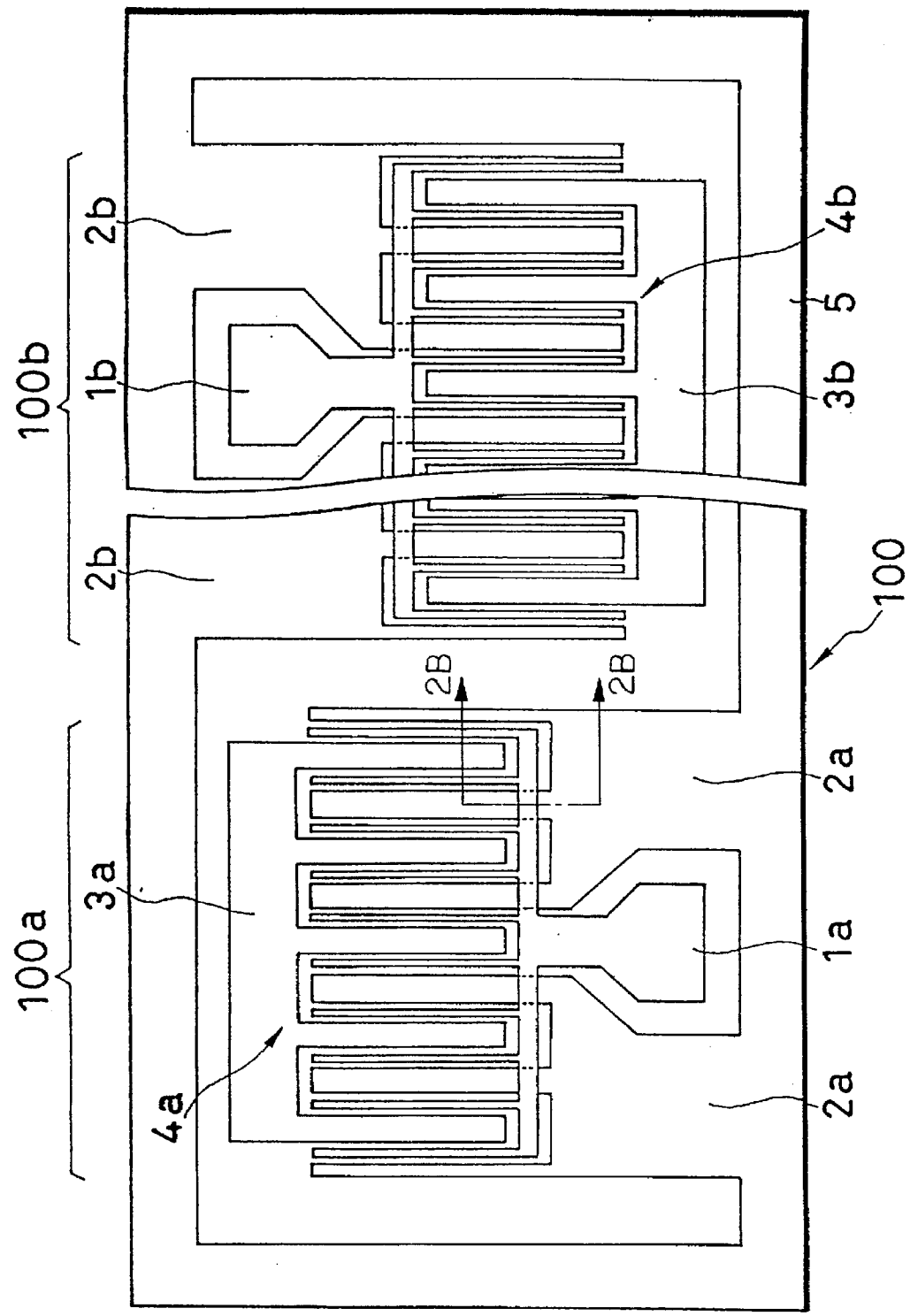

SEMICONDUCTOR DEVICE CONSTITUTING MULTI-STAGE POWER AMPLIFIER

This is a continuation of application Ser. No. 08/285,526 filed Aug. 4, 1994, now abandoned.

BACKGROUND OF THE INVENTION (1) Field of the Invention

The present invention relates to a semiconductor device for forming a power amplifier, and more particularly to a semiconductor device for forming a multi-stage ultra high frequency power amplifier.

(2) Description of the Related Art

A conventional multi-stage power amplifier of the kind to which the present invention relates is described with reference to and by example of a two stage power amplifier. FIG. 1A is an outline of the constitution of a conventional power amplifier and FIG. 1B is an equivalent circuit diagram thereof. The power amplifier shown in FIGS. 1A and 1B is provided with an input matching circuit 7, a driver transistor 300 constituted from a MES (Metal-semiconductor) type field effect transistor, an inter-stage matching circuit 8, a final or output stage transistor 400 constituted from a plurality of MES type field effect transistors, and an output matching circuit 9. The driver and final stage transistors 300, 400 are discrete components, and are mounted together with the respective matching circuits 7, 8 and 9 on a wiring circuit board.

This type of multi-stage power amplifier is used in great quantities in the power module etc. of cellular handheld telephones and, recently, components for such uses have been subjected to strong demands for miniaturizing and cost reduction. But, because conventional multi-stage power amplifiers use discrete power transistors at each stage, the size of the whole power amplifier, including the matching circuits, on the wiring circuit board becomes inevitably large. Also, in the conventional examples, a large number of components, a wiring circuit board with a large surface area, a large number of assembly and processing stages, all make cost reduction difficult. Also, in the conventional examples, particularly when miniaturizing, oscillation becomes more likely because of the difficulty in obtaining sufficient isolation between the previous and subsequent stages.

SUMMARY OF THE INVENTION

An object of the present invention, therefore, is to overcome the problems existing in the prior art and to provide an improved semiconductor device for forming a multi-stage ultra high frequency power amplifier.

According to the present invention, in order to solve the aforementioned problems, a semiconductor device is provided where on the same chip, a plurality of transistors for forming a multi-stage power amplifier are arranged such that input terminals and output terminals of the respective transistors are in alternating directions and, furthermore, each transistor's ground terminal is short-circuited with the ground metallization layer formed on the chip.

According to the invention which relates to a semiconductor device for constituting a multi-stage power amplifier, since the directions of a plurality of transistors are alternately arranged on one single chip, the connection of a matching circuit becomes easier, and it is possible to miniaturize an overall multi-stage power amplifier including a matching circuit on a wiring circuit board. Also, it becomes possible to introduce low priced power modules because of a reduction in the number of components, contraction of the area of the wiring circuit board, and simplified assembly and processing. Furthermore, parasitic oscillation can be prevented since each transistor's ground terminal is directly grounded on the chip, parasitic capacitance and/or parasitic inductance can be made smaller when compared with a power amplifier constituted by discrete transistors, and the two terminals (pads) where the same phase signal appears can be separated by a ground line.

BRIEF DESCRIPTION OF THE DRAWINGS

The above and other objects, features and advantages of the present invention will be apparent from the following description of preferred embodiments of the invention explained with reference to the accompanying drawings, in which:

FIG. 2A is a plan view of a device of a first embodiment according to the invention.

PREFERRED EMBODIMENTS OF THE INVENTION

Now, embodiments of the invention are described with reference to the attached drawings.

Figure 1A:
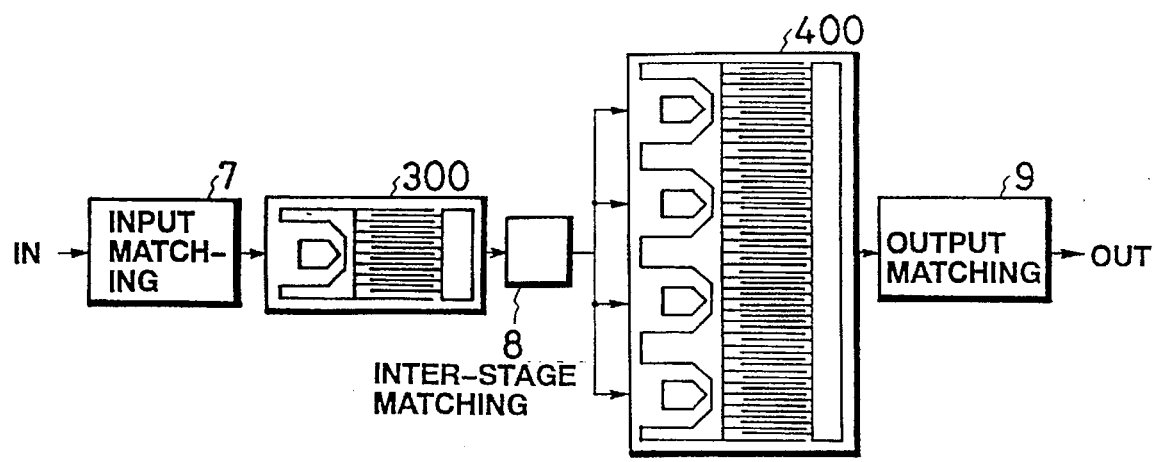
FIG. 1A is a block diagram of a power module constituted in a conventional configuration.
Figure 1B:
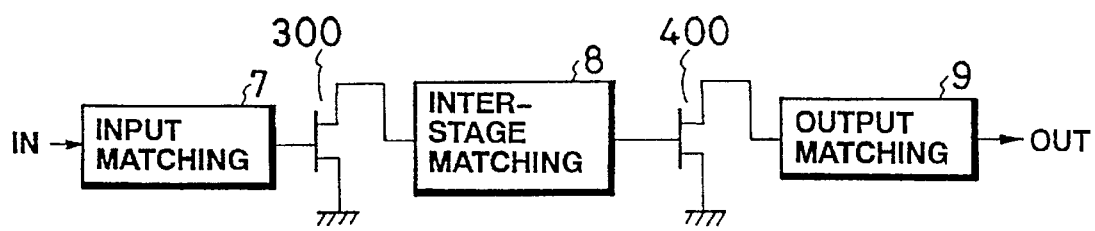
FIG. 1B is an equivalent circuit diagram thereof.
Figure 2B:
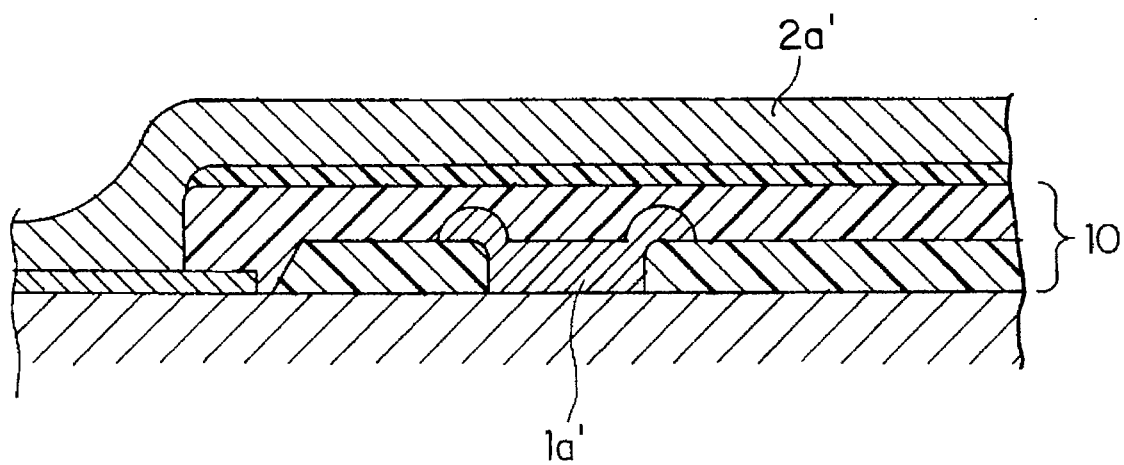
FIG. 2B is a cross sectional view taken along a line 2B—2B in FIG. 2A.
Figure 3:
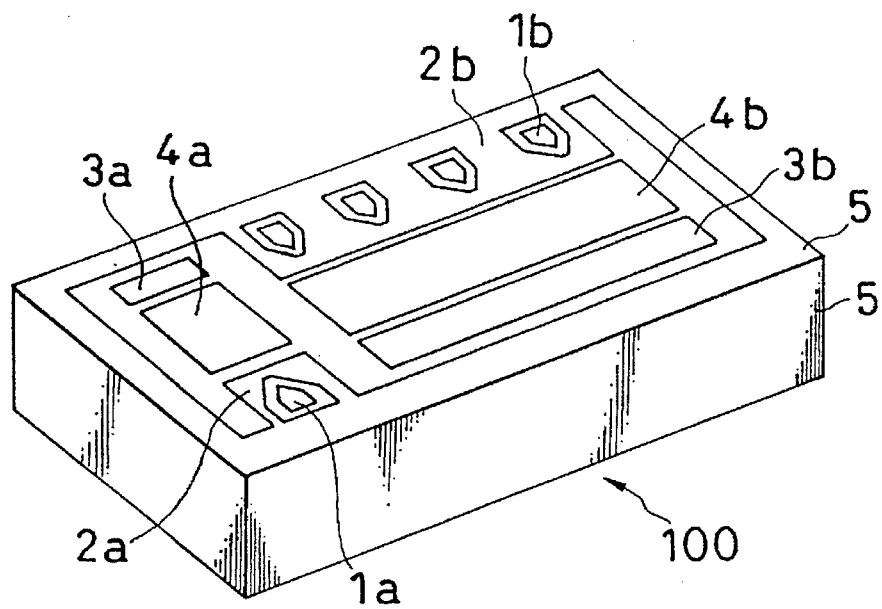
FIG. 3 is a perspective view of the device of the first embodiment according to the invention.

FIG. 2 shows in a plan view a structure of a first embodiment of this invention. FIG. 3 is a perspective view of the same structure.

As shown in FIGS. 2A and 3, the power transistor IC 100 according to the invention is composed of an input stage transistor 100a, consisting of a MES type field effect transistor which has a gate width of 2 mm, and an output stage transistor 100b, consisting of four MES type field effect transistors connected in parallel, each of which has a gate width of 10 mm.

The input stage transistor 100a has a gate pad 1a, a source pad 2a, a drain pad 3a, and an active region 4a. The gate pad 1a, source pad 2a and drain pad 3a are formed on a semi-insulating GaAs substrate, and they are connected to a gate electrode, source electrode, and drain electrode, respectively, which are formed in a comb shape on the active region 4a. These comb shaped electrodes are in contact with a silicon (Si) doped GaAs layer formed on the semi-insulating GaAs substrate. A $SiO_2$ film 10 is formed at the crossing section of the source electrode 2a" and gate electrode 1a' as shown in FIG. 2B which is a cross sectional view taken along a line 2B—2B in FIG. 2A. In this arrangement, the gate pad 1a serves as an input terminal of the device.

In the same way, each transistor in the output stage transistor 100b has a gate pad 1b, source pad 2b, drain pad 3b, and active region 4b. The gate pad 1b, source pad 2b and drain pad 3b are formed on the semi-insulating GaAs substrate. They are connected respectively to a gate electrode, source electrode, and drain electrode which are formed in a comb shape on the active region 4b. The comb shaped electrodes are in contact with Si doped GaAs layer formed on the semi-insulating GaAs substrate. A SiO₂ film is formed at the crossing section of the source and gate electrodes.

A ground metallization layer 5 is formed on a back and a side Surface of a semiconductor substrate and on an outside perimeter section of a front surface of the semi-conductor substrate, and each transistor's source pad 2a, 2b, is connected to the ground metallization layer 5.

Signals of the same phase are applied to the gate pad 1a of the input stage transistor 100a and the drain pad 3b of the output stage transistor 100b, respectively. Thus, in the case when these pads are positioned in close proximity, positive feedback can take place and the possibility of oscillation increases. In this embodiment of the invention, high frequency coupling between both the pads is prevented by the grounded source pad 2a of the input stage transistor 100a lying between the gate pad 1a and the drain pad 3b.

Figure 4:
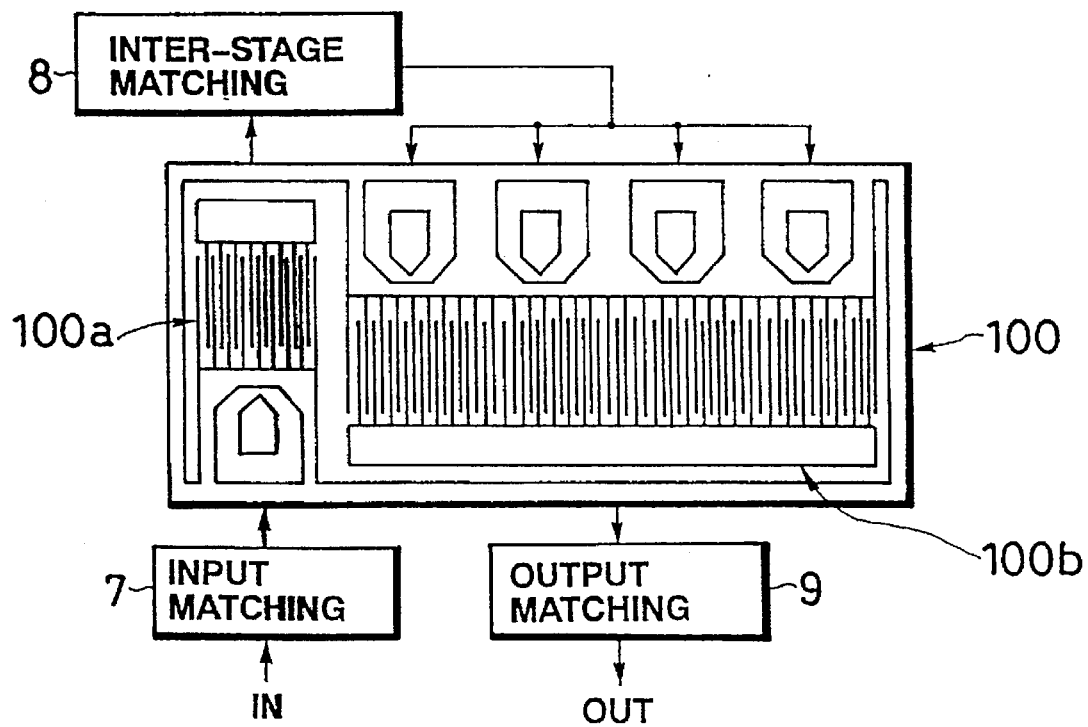
FIG. 4 is a block diagram of a power module constituted by using the device of the first embodiment according to the invention.

FIG. 4 is a diagram of the power module block constituted by using the semiconductor device of this embodiment. The figure also shows such external components as an input matching circuit 7, an inter-stage matching circuit 8, and an output matching circuit 9.

By employing the semiconductor device of this embodiment in the power module, the component numbers are reduced, the overall size is reduced, and as a result of the alternate arrangement of the multi-stage transistor input/out terminals, external connection of the external components is easier, which enables an even greater possibility of capitalizing on the miniaturization of the module. Furthermore, when compared with a module constituted by discrete transistors, stray capacitance and/or stray inductance developing around the transistor are reduced and such undesirable oscillation as parasitic oscillation is prevented accordingly.

Figure 5A:
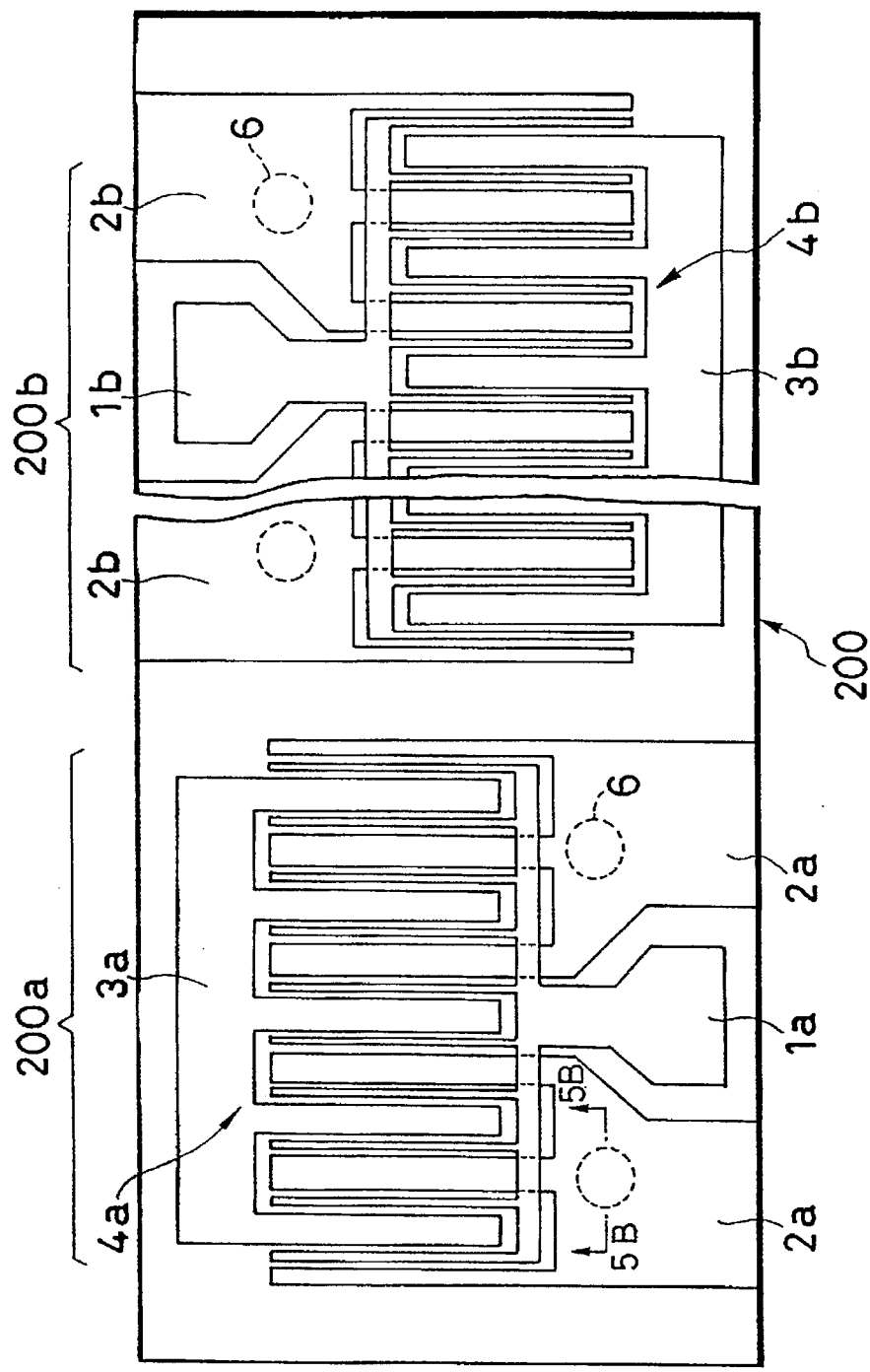
FIG. 5A is a plan view of the device of the second embodiment according to the invention.
Figure 5B:
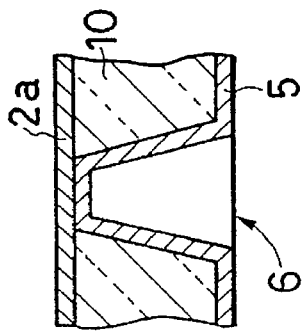
FIG. 5B is a cross sectional view taken along a line 5B—5B in FIG. 5A.

FIG. 5A is a plan view of a second embodiment of this invention and FIG. 5B is a cross section taken along a line 5B—5B in FIG. 5A. In this embodiment, as well as in the previous embodiment, a power transistor IC 200 consists of a two stage transistor circuit composed of an input stage transistor 200a and an output stage transistor 200b. The difference between this embodiment and the previous embodiment of FIG. 2 is that the ground metallization layer formed on the perimeter of the substrate surface and side in the previous embodiment has been eliminated in this embodiment and instead the ground metallization layer 5 is connected to the source electrodes 2a, 2b, by a via hole 6, as shown in FIG. 5B, opened in the semi-insulating GaAs substrate 10. The merit of this embodiment is that the semiconductor device can be completed before wafer dicing.

In the previous embodiment, the source electrode is grounded using the side metallization layer which leads to an inductance of about 0.05 nH between the source and ground. If the constituted power module is for 900 MHz band applications, then this level of inductance will not cause any particular inconveniences. But, for constituting 3 GHz or higher frequency band power amplifiers, then it is required to reduce the inductance even more. In this embodiment, by the use of via holes 6, the inductance between the source and ground can be reduced to less than 0.025 nH and be applied to the above frequency band power amplifiers.

While the invention has been described in its preferred embodiments, it is to be understood that the words which have been used are words of description rather than limitation and that changes within the purview of the appended claims may be made without departing from the true scope and spirit of the invention in its broader aspects. For example, instead of a MES type transistor, other types of transistors such as a MOS type transistor, a SIT or bipolar transistor can be used. Also, whereas the embodiments covered a semiconductor device for a two stage power amplifier, the use of such a semiconductor device for providing a semiconductor device of three or more transistors for constituting an amplifier which includes a pre-driver, driver and final stage transistor is also conceivable. Furthermore, it is also possible to constitute a semiconductor device having both the side metallization layer and the via hole by combining the first and second embodiments. Also, at the crossing section of the gate electrode and source electrode it is possible to use an air-gap instead of a SiO₂ film.

What is claimed is:

1. A semiconductor device having a multi-stage power amplifier, comprising:

a plurality of transistors disposed on a chip, for forming said multi-stage power amplifier, and arranged such that an input stage with an input terminal, having at least one of said plurality of transistors, is aligned so that an input signal propagates along a first line aligned in a first direction, and an output stage with an output terminal, having at least two of said plurality of transistors, is aligned so that an output signal propagates along a second line aligned in a second direction opposite to said first direction, said second line being parallel to said first line; and a ground metallization layer formed on said chip and short-circuited with a ground terminal of each of said transistors of said input stage and said output stage.

2. A semiconductor device according to claim 1, in which each of said plurality of transistors comprises a gate pad, a source pad, a drain pad, and an active region which are formed on a semi-insulating substrate, said gate pad, said source pad and said drain pad being in contact respectively with a gate electrode, a source electrode and a drain electrode said gate source and drain electrodes being formed in a comb shape in said active region.

3. A semiconductor device according to claim 2, in which said semi-insulating substrate is a semi-insulating GaAs substrate.

4. A semiconductor device according to claim 1, in which said ground metallization layer is disposed on a back and a side surface of a semiconductor substrate and on an outside perimeter section of an active layer on a front surface of the semiconductor substrate, said ground metallization layer disposed on the outside perimeter section being connected to said ground terminals of each of said transistors of said input stage and said output stage.

5. A semiconductor device according to claim 4, which further comprises a via hole formed in said semi-insulating substrate and in which said ground terminals of each of said transistors of said input stage and said output stage being connected through said via hole to said ground metallization layer disposed on a back surface of the semi-insulating substrate.

6. A semiconductor device according to claim 1, in which said ground terminals of each of said transistors of said input stage and said output stage lie between adjacent transistors of said input stage and of said output stage.

7. A semiconductor device according to claim 2, in which a crossing section between said source and gate electrodes of each of said transistors in said input stage and said output stage is provided with an SiO₂ film to isolate them from each other.

* * * * *